(12) United States Patent
Frisina et al.

(10) Patent No.: US 6,365,931 B1
(45) Date of Patent: Apr. 2, 2002

(54) GATE INSULATING STRUCTURE FOR POWER DEVICES, AND RELATED MANUFACTURING PROCESS

(75) Inventors: Ferruccio Frisina, Sant'Agata Li Battiati; Giuseppe Ferla, Catania, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/412,475

(22) Filed: Oct. 5, 1999

(30) Foreign Application Priority Data

Oct. 6, 1998 (EP) .............................. 98830585

(51) Int. Cl.$^7$ .................. H01L 29/76; H01L 29/94; H01L 31/062
(52) U.S. Cl. .................. 257/341; 257/339; 257/342
(58) Field of Search ................ 257/339, 341, 257/342

(56) References Cited

U.S. PATENT DOCUMENTS

| | | | |
|---|---|---|---|
| 4,443,931 A | 4/1984 | Baliga et al. | 29/571 |
| 5,071,780 A | 12/1991 | Tsai | 437/41 |
| 5,235,206 A | 8/1993 | Desilets et al. | 257/578 |
| 5,631,484 A | * 5/1997 | Tsoi et al. | 257/341 |

FOREIGN PATENT DOCUMENTS

| | | | |
|---|---|---|---|
| EP | 0 435 406 A1 | 7/1991 | 257/341 |
| EP | 0 689 238 A1 | 12/1995 | 257/341 |
| EP | 0 843 349 A1 | 5/1998 | 257/565 |
| JP | 59-21066 | * 2/1984 | 257/341 |

OTHER PUBLICATIONS

European Search Report from European patent application 98830585.0. filed Oct. 6, 1998.

* cited by examiner

Primary Examiner—Steven Loke
(74) Attorney, Agent, or Firm—Wolf, Greenfield & Sacks, P.C.; James H. Morris

(57) ABSTRACT

Semiconductor power device including a semiconductor layer of a first type of conductivity, wherein a body region of a second type of conductivity including source regions of the first type of conductivity is formed, a gate oxide layer superimposed to the semiconductor layer with an opening over the body region, polysilicon regions superimposed to the gate oxide layer, and regions of a first insulating material superimposed to the polysilicon regions. The device includes regions of a second insulating material situated on a side of both the polysilicon regions and the regions of a first insulating material and over zones of the gate oxide layer situated near the opening on the body region, oxide regions interposed between the polysilicon regions and the regions of a second insulating material, oxide spacers superimposed to the regions of a second insulating material.

8 Claims, 4 Drawing Sheets

GATE INSULATING STRUCTURE FOR POWER DEVICES, AND RELATED MANUFACTURING PROCESS

BACKGROUND OF THE INVENTION

1. Field of the Invention

The present invention relates to a gate insulating structure for power devices, and to a related manufacturing process.

2. Discussion of the Related Art

In power MOS devices, the gate insulation in respect to the metal source layer is assured by a dielectric layer that covers the polysilicon constituting the gate, insulating it from the metal source layer. This occurs through a deposition of a deposited oxide layer (vapox) or of a phosphorus doped deposited oxide (pvapox), and a subsequent photolithographic process that defines the contact between the source and the body.

FIG. 1 shows a cross-sectional view of a basic structure of a power MOS device, having a gate insulation according to the prior art. A dielectric layer 6 formed by deposited oxide (vapox) or by phosphorus doped deposited oxide (pvapox) assures the insulation of the polysilicon layer 5, corresponding to the gate electrode, from the metal layer 7 (constituted, for example, by aluminum), both over the upper surface and over the vertical walls. The metal layer 7 connects the source regions 3 and the body region 2, obtained in the semiconductor layer 1. A thin gate oxide layer 4 is located under the polysilicon layer 5.

The polysilicon layer 5 vertical wall is protected by the dielectric thickness which depends on the process conditions and on the utilized photoexposure machines. Generally, this means that the distance between contact and polysilicon can not be reduced under one micron (usually such a distance is between 1 and 3 $\mu$m). The problems related to this technique come out in the case where the dimensions of the polysilicon opening are about one micron, because the contact opening and the lateral insulation of the vertical polysilicon layer wall must be assured simultaneously.

In order to solve the above mentioned problems, other techniques for obtaining gate insulation and contact opening have been introduced. These techniques use a process of spacer formation in order to obtain, at the same time, the gate insulation and the contact opening, without using photolithographic techniques. An example of such a manufacturing technique for the spacer formation is provided by U.S. Pat. No. 4,256,514 in the name of IBM.

FIG. 2 shows a basic structure of a power MOS device wherein spacers 8 are utilized for lateral insulation of the polysilicon layer 5 walls. In this case the dimensions of the spacer 8 "foot" depend on the height of the superimposed layers structure constituted by the gate oxide layer 4 (having a thickness comprised between 100 and 500 Å), by the polysilicon layer 5 and by the vapox layer 6 both with a thickness comprised between 2000 and 5000 Å, and are comprised between 1000 and 4000 Å and then submicrometric: such a feature allows obtaining polysilicon openings of about one micron or less, and contacts lower than one micron.

The spacer as described has been commonly used in VLSI technology as a technique for obtaining alignment of implants with submicrometric dimensions otherwise impossible through photolithographic techniques.

Other gate insulation techniques provide for spacers constituted by silicon nitride. The silicon nitride represents an ideal material for obtaining a gate insulation along the vertical walls, due to its physic-chemical properties (a very good insulator for diffusion of water, humidity, sodium and oxygen) and to its capability of being deposited with a very good coverage.

The utilization of silicon nitride for obtaining spacers offers excellent results in terms of gate insulation, but produces serious problems with respect to good device operation due to the stress that the nitride transmits to the silicon. The stress transmitted by the nitride to the silicon (highly depending on the deposited nitride thickness) produces some dislocations in the regions under the spacers, which dislocations increase the device leakage current, and moreover these dislocations propagate in the channel regions and in the regions under the gate oxide, degrading the oxide quality.

The stress transmitted by the silicon nitride spacer that can generate and propagate dislocations or fractures, can be caused by the different thermal expansion coefficients between silicon and nitride film. Furthermore, the nitride transmits compression or tension stress to the silicon according to the deposition temperature, so causing the generation of dislocations or fractures in the silicon into contact.

A solution of the above mentioned problems about stress and subsequent dislocations in the silicon is provided by the substitution of the silicon nitride with a deposited oxide (vapox) or a phosphorus doped deposited oxide (pvapox) for the insulating spacer formation.

Such materials have problems related to the submicrometric spacer dimensions, even if they do not produce stress in the silicon structure and then undesirable dislocations in it. By subjecting the power MOS devices comprising vapox or pvapox spacers to a reliability test called a "pressure-cooker" test, which consists of keeping the device at an ambient temperature of 175° C. with 80% humidity for a complete time between 168 and 336 hours, a fall in threshold voltage of between 10% and 50% of the initial value is obtained. Moreover, as a result of the above mentioned phenomenon, the following features occur:

- by applying a positive voltage between the gate electrode and the drain electrode, a threshold voltage recovery is obtained;
- by applying a negative voltage between the gate electrode and the drain electrode, a further fall in threshold voltage is obtained;
- the above mentioned variations are strongly affected by temperature (in a range between 25° C. and 200° C., the time changes from many hours to a few minutes).

To explain such a mechanism, an implication of the reaction between the metal (for example aluminum) layer and water during the time the device is in the humid, high temperature environment, is supposed: such a reaction produces protons (hydrogen ions) which cross the spacer (if sufficiently thin) and reach the silicon wherein they can bind themselves to the ion of the material constituting the body (for example boron) in the channel region, so producing a fall in channel charge concentration and a consequent fall in threshold voltage. It is evident that such a mechanism particularly depends on the submicrometric dimensions of the spacer used for the gate insulation.

As described till now, it appears that when the dimensions of the insulating layer of the vertical gate wall are submicrometric, the utilization of conventional materials like vapox or pvapox to obtain insulating spacers produces problems related to the threshold voltage; on the other hand, the utilization of alternative materials like silicon nitride generates problems related to the stress transmission that can cause dislocations or fractures in the silicon.

In view of the state of the art described, it is an object of the present invention to provide a gate insulation structure for power devices, in order to solve at least the above-mentioned problems.

SUMMARY OF THE INVENTION

According to the present invention, this and other objects are achieved by a semiconductor power device comprising a semiconductor layer of a first type of conductivity, wherein a body region of a second type of conductivity comprising source regions of the first type of conductivity is formed, a gate oxide layer superimposed to said semiconductor layer with an opening over said body region, polysilicon regions superimposed to said gate oxide layer, regions of a first insulating material superimposed to said polysilicon regions, comprising regions of a second insulating material situated on a side of both said polysilicon regions and said regions of a first insulating material and over zones of said gate oxide layer situated near said opening on said body region, oxide regions interposed between said polysilicon regions and said regions of a second insulating material, oxide spacers superimposed to said regions of a second insulating material.

BRIEF DESCRIPTION OF THE DRAWINGS

The features and advantages of the present invention will be made clearer by the following detailed description of two particular embodiments thereof, illustrated as non-limiting examples in the annexed drawings, wherein.

DETAILED DESCRIPTION

Figure 1:
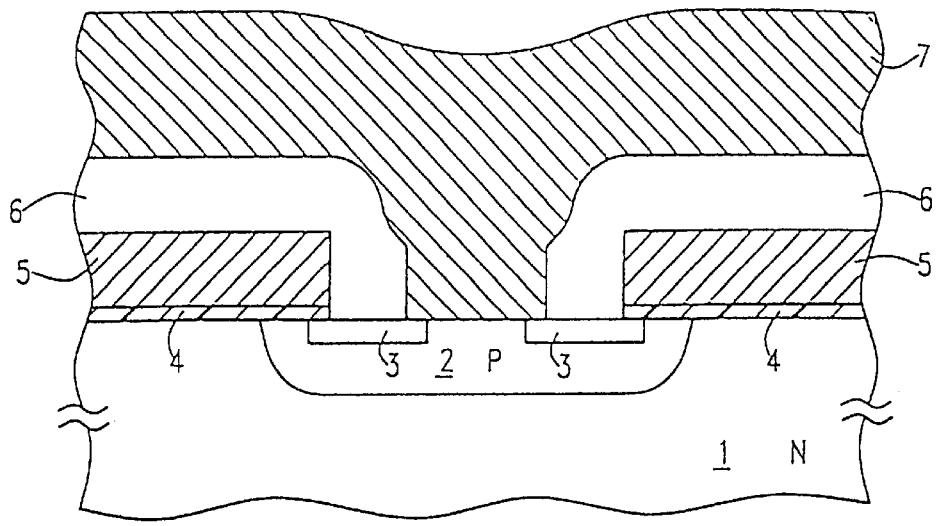
FIG. 1 shows a cross-sectional view of a first gate insulating structure of a power MOS device, according to the prior art.
Figure 2:
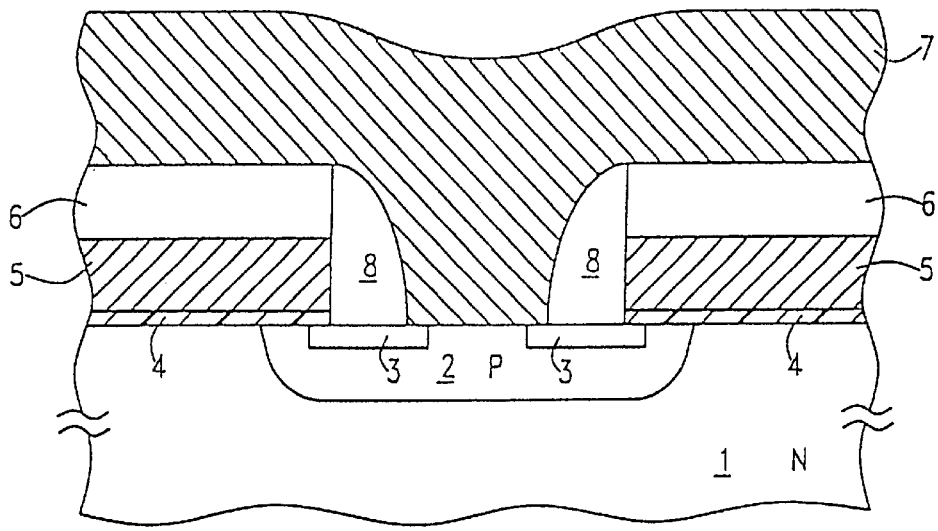
FIG. 2 shows a cross-sectional view of a second gate insulating structure of a power MOS device, according to the prior art.
Figure 3:
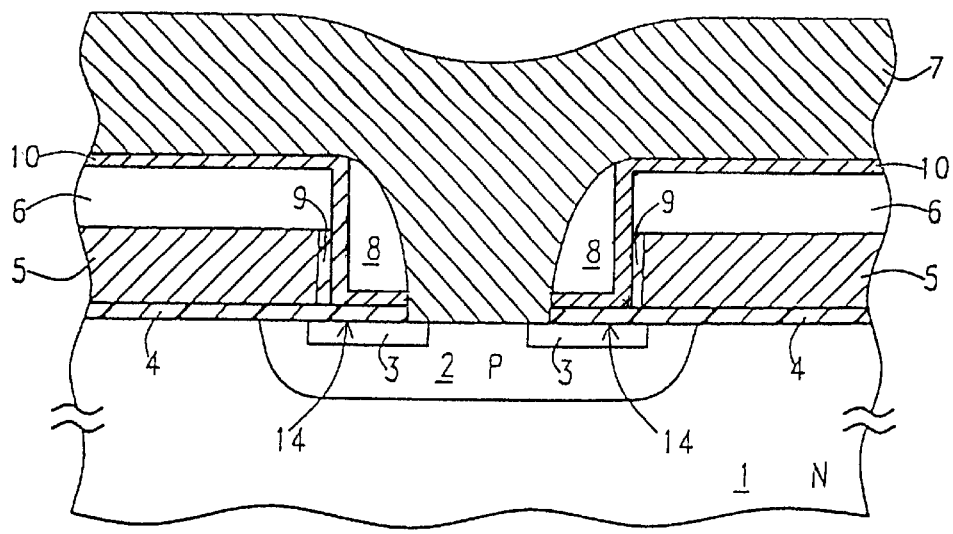
FIG. 3 shows a cross-sectional view of a gate insulating structure of a power MOS device, according to a first embodiment of the present invention.

FIG. 3 shows a section view of a gate insulating structure of a power MOS device, according to a first embodiment of the present invention. Particularly, the insulating structure is composed three layers, each with a different function, but all fitting together to assure an excellent gate insulation, both electrical and physical-chemical.

The first of the three layers constituting the insulating structure is represented by a thermal oxide region 14 which extends over the source region 3 of the power device, and corresponds to a "prolongation" of the gate oxide layer 4.

The second of the three layers is constituted by a silicon nitride layer 10 which extends over the oxide region 14, over the vertical walls of the polysilicon layer 5 and of the deposited oxide layer 6, so as to cover the entire horizontal surface of the deposited oxide layer 6. In a second embodiment of the present invention, shown in the FIGS. 4–10, the nitride layer 10 is not present over the horizontal surface of the deposited oxide layer 6, but only over the lateral walls of the polysilicon layer 5 and of the deposited oxide layer 6 and over the thermal oxide region 14, assuming a L shape.

The third layer is constituted by deposited oxide 8 (vapox or pvapox) which forms the lateral insulating spacer together with the second nitride layer 10. Over the lateral wall of the polysilicon layer 5, an oxide layer 9 separating the polysilicon layer 5 from the nitride layer 10 is placed, and it has the purpose of reducing the stress transmitted by the nitride layer 10, which stress can provoke dislocations or fractures in the polysilicon layer 5.

The thickness of the lateral oxide layer 9 is about equal in size to the thickness of the gate oxide layer 4.

The oxide region 14 is the foot on which the spacer (in particular the nitride layer 10) rests and it has the function of "absorbing" or reducing the stress that the nitride transmits to the silicon, so avoiding the formation and propagation of dislocations or fractures in the silicon itself.

The nitride layer 10 has a thickness of about 300–700 Å in size (then lower than the critical thickness) also in the vertical wall, so that the transmitted stress is considerably reduced.

The deposited oxide layer 8 is used to assure an excellent mechanical and electrical insulation of the gate, and a good step coverage for the subsequent metallization.

With such a composed structure a good gate electrical insulation is assured, a considerable reduction of the stress that the nitride transmits to the silicon is obtained, and moreover the problem related to the threshold voltage fall as a result of tests in humid and high temperature conditions is solved, due to the presence of the nitride layer 10 that stops the possible hydrogen ions (protons) migration towards the silicon.

FIGS. 4 to 10 show schematically the main steps of a manufacturing process for obtaining a gate insulating structure according to a second embodiment of the present invention.

Figure 4:
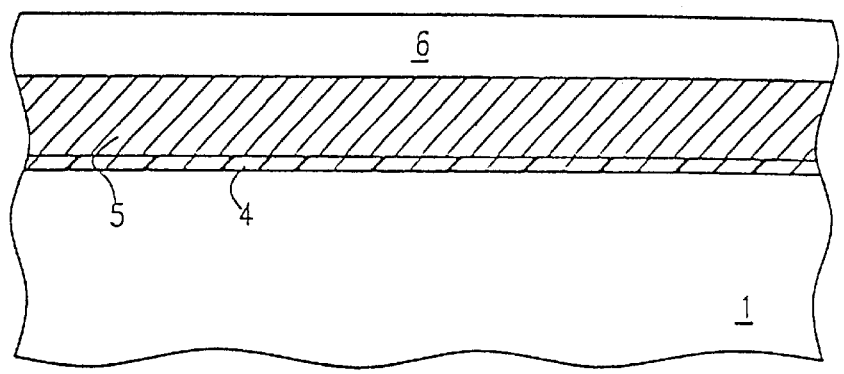
FIGS. 4 to 10 show schematically the main steps of a manufacturing process for obtaining a gate insulating structure of a power MOS device, according to a second embodiment of the present invention.

FIG. 4 shows the initial manufacturing step wherein a thin silicon oxide layer 4 (that constitutes the gate oxide layer 4) is grown over a silicon layer 1, then a polysilicon layer 5 is deposited, and at last a first deposited oxide layer 6 (vapox) is deposited.

Figure 5:
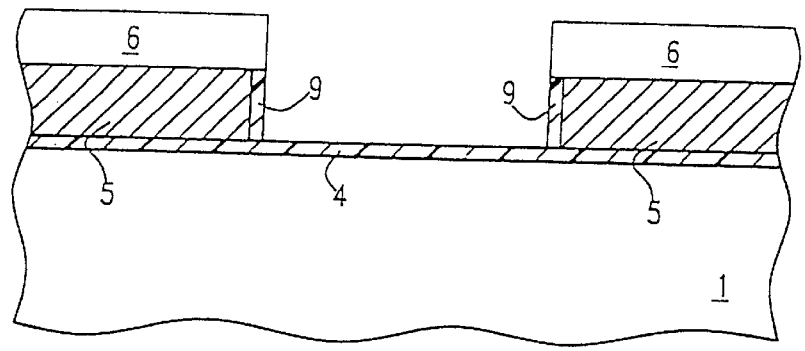

FIG. 5 shows the subsequent step wherein selective etching and consequent removal of both vapox 6 and polysilicon layer 5 is obtained. Just after, both dopant ion implantation and subsequent diffusion of the body and dopant ion implantation and subsequent diffusion of the source regions are accomplished. At this point also lateral oxidation of the polysilicon layer 5 is obtained in order to form the lateral oxide layers 9.

Figure 6:
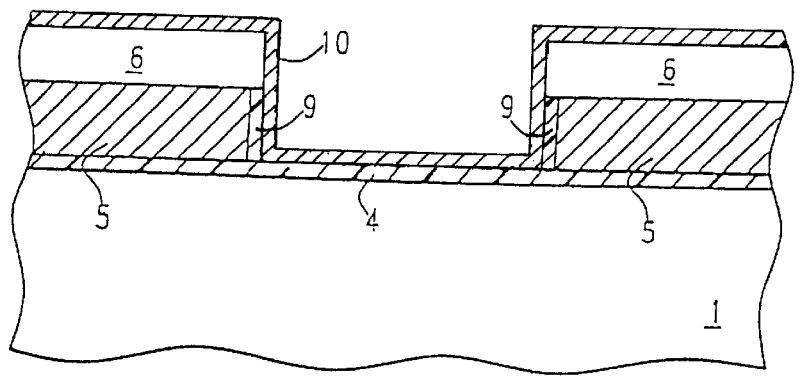

With reference to FIG. 6, the subsequent step wherein a silicon nitride layer 10 with a thickness comprised between 300 and 700 Å is deposited over the entire device surface, is shown.

Figure 7:
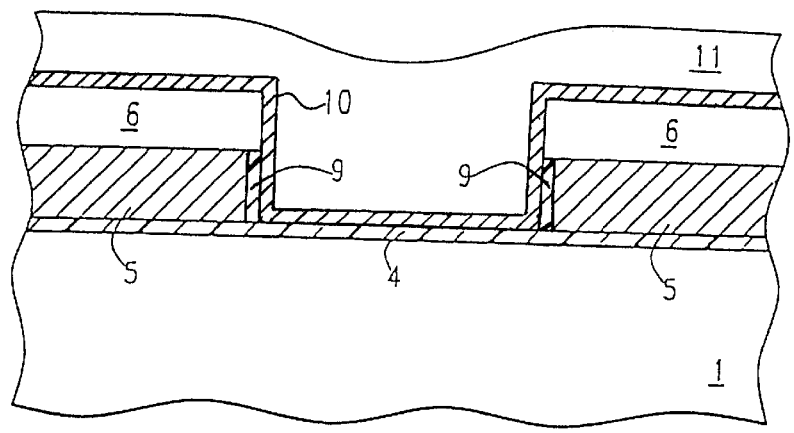
Figure 8:
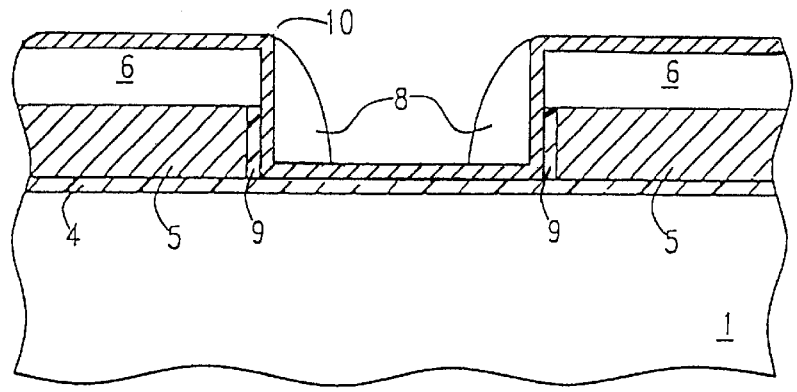

FIG. 7 shows the insulating structure just after deposition of both a silicon nitride layer 10 and a second deposited oxide layer 11 (vapox) over all the device surface. FIG. 8 shows the same structure after stabilizing treatments of the process gases, and subsequent selective etching of the vapox 11 with endpoint on the nitride layer 10, with the consequent formation of the spacers 8.

Figure 9:
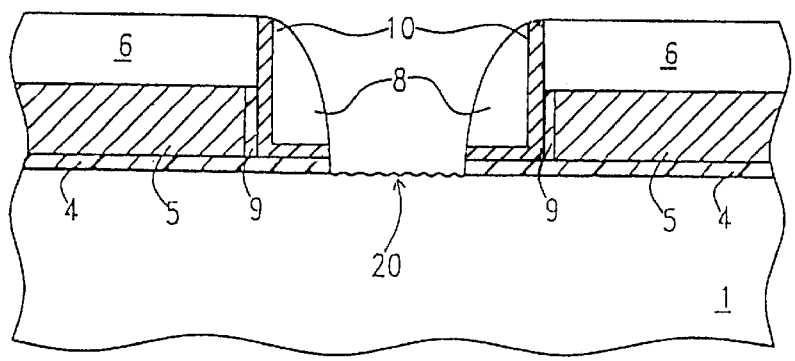
Figure 10:
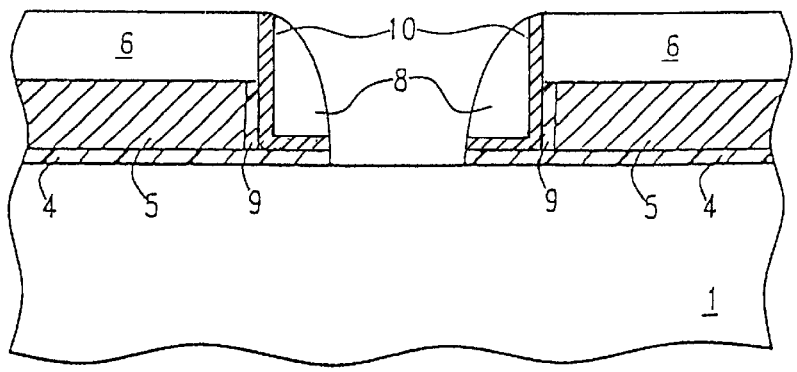

FIG. 9 shows the subsequent step of selective etching and removal of both the nitride layer 10 and the oxide layer 4, with the contacts opening formation in the silicon. As it can be noted, differently from the first embodiment wherein the nitride layer 10 is also located over the horizontal surface of the deposited oxide 6, in this case it is etched and removed, being situated only over the sidewalls and over the gate oxide, assuming a L shape.

Before the metallization step through which the metal layer 7 is deposited in order to obtain a contact between the source regions and the body, it is necessary to assure a good quality of the interface 20 between metal layer and silicon. For this reason a soft etching step is provided, as shown in FIG. 7, wherein the silicon superficial layers damaged by the precedent etching step are removed, and a polishing of the silicon surface is accomplished. Then the process continues according to the prior art, for example with a metal layer deposition for contacting the body region and the source regions, and so on.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Semiconductor power device comprising a semiconductor layer of a first type of conductivity, wherein a body region of a second type of conductivity comprising source regions of the first type of conductivity is formed, a gate oxide layer superimposed to said semiconductor layer with an opening over said body region, polysilicon regions superimposed to said gate oxide layer, regions of a first insulating material superimposed to said polysilicon regions, regions of a second insulating material situated on side of both said polysilicon regions and said regions of a first insulating material and over zones of said gate oxide layer situated near said opening on said body region, oxide regions interposed between said polysilicon regions and said regions of a second insulating material, oxide spacers superimposed to said regions of a second insulating material.

2. Device according to claim 1, wherein said regions of a second insulating material extend over said regions of a first insulating material.

3. Device according to claim 1, further comprising a metal layer superimposed to said device to contact said body region and said source regions.

4. Device according to claim 1, wherein said first insulating material is deposited oxide.

5. Device according to claim 4, wherein said deposited oxide is phosphorus doped.

6. Device according to claim 1, wherein said second insulating material is silicon nitride.

7. Device according to claim 1, wherein said first type of conductivity is N type, and said second type of conductivity is P type.

8. Device according to claim 1, wherein said first type of conductivity is P type, and said second type of conductivity is N type.

\* \* \* \* \*